United States Patent
Rao et al.

(10) Patent No.: US 6,271,725 B1
(45) Date of Patent: Aug. 7, 2001

(54) LOW VOLTAGE BIPOLAR TRANSCONDUCTOR CIRCUIT WITH EXTENDED DYNAMIC RANGE

(75) Inventors: Narendra M. K. Rao; Vishnu Balan, both of San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/383,108

(22) Filed: Aug. 25, 1999

Related U.S. Application Data

(60) Provisional application No. 60/102,524, filed on Sep. 30, 1998.

(51) Int. Cl.[7] ........................................... H03F 3/45
(52) U.S. Cl. ................................ 330/252; 330/261
(58) Field of Search ........................... 330/252, 258, 330/259, 261

(56) References Cited

U.S. PATENT DOCUMENTS

| | | | |
|---|---|---|---|
| Re. 36,861 | * | 9/2000 | Koyama et al. ............ 330/261 |
| 4,379,268 | * | 4/1983 | Nagata .................... 330/261 |
| 4,707,681 | | 11/1987 | Eggenberger et al. ...... 340/347 DD |
| 4,748,420 | * | 5/1988 | Metz ...................... 330/252 |
| 5,006,818 | * | 4/1991 | Koyama et al. ............ 330/261 |
| 5,081,423 | * | 1/1992 | Koyama et al. ............ 330/252 |
| 5,289,136 | * | 2/1994 | DeVeirman et al. ......... 330/252 |
| 5,343,163 | * | 8/1994 | Linder et al. ............ 330/252 |

OTHER PUBLICATIONS

Cideciyan, Roy D.; Dolivo, Francois; Hermann, Reto; Hirt, Walter, "A PRML System for Digital Magnetic Recording", Jan. 1, 1992, IEEE Journal on Selected Areas in Communications.

N. Rao, V. Balan, R. Contreras, "A 3V 10–100 $MH_z$ Continuous–Time Seventh–Order 0.05° Equiripple Linear–Phase Filter", 1999 International Solid–State Circuits Conference, San Francisco, CA., Feb. 15, 1999.

* cited by examiner

*Primary Examiner*—Robert Pascal
*Assistant Examiner*—Khanh Van Nguyen

(57) ABSTRACT

A low voltage bipolar transconductor circuit with extended dynamic range is disclosed. The transconductance circuit provides a differential current output signal and generally comprises a first and a second differential pair of transistors coupled to a differential input signal and to a load, and having transistors area ratios of 1:r and r:1, respectively. The transconductance circuit further comprises at least one first pair of diodes having positive nodes coupled to each other and to the load, negative nodes coupled to the first differential transistors, and a diode area ratio of r:1, and a least one second pair of diodes having positive nodes coupled to each other and to the load, negative nodes coupled to the second differential transistors, and having a diode area ratio of 1:r.

14 Claims, 6 Drawing Sheets

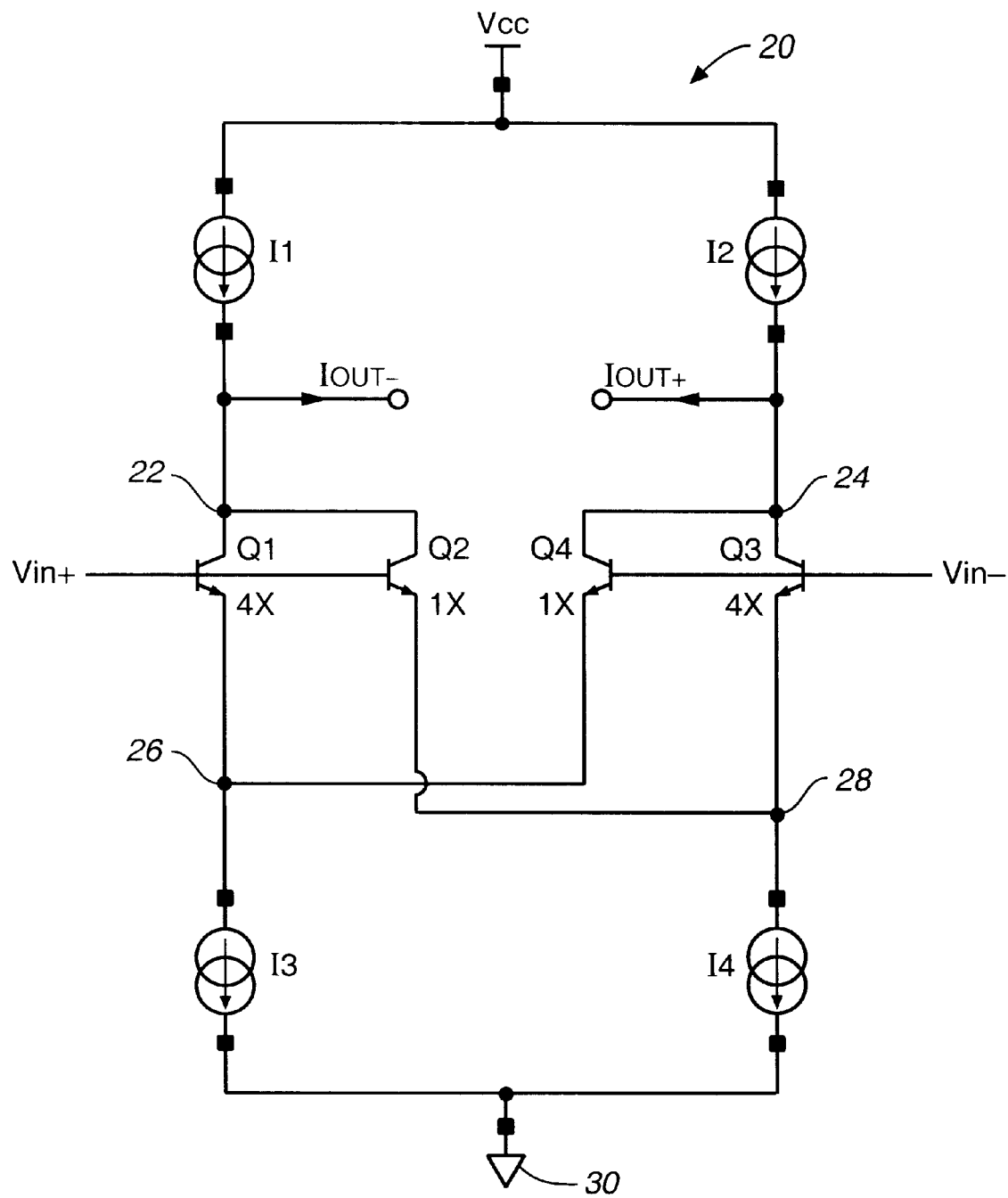
FIG._1

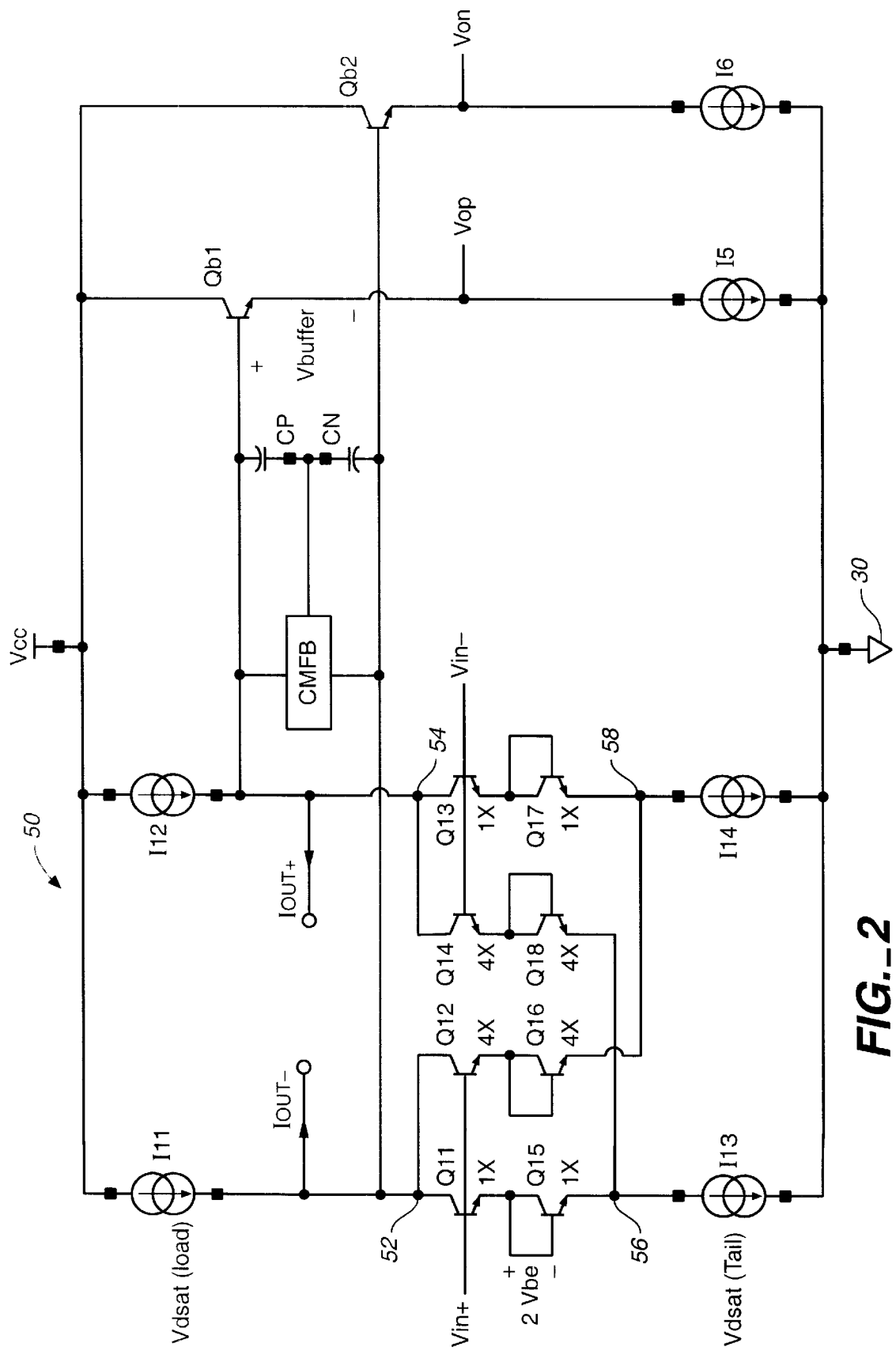
FIG._2

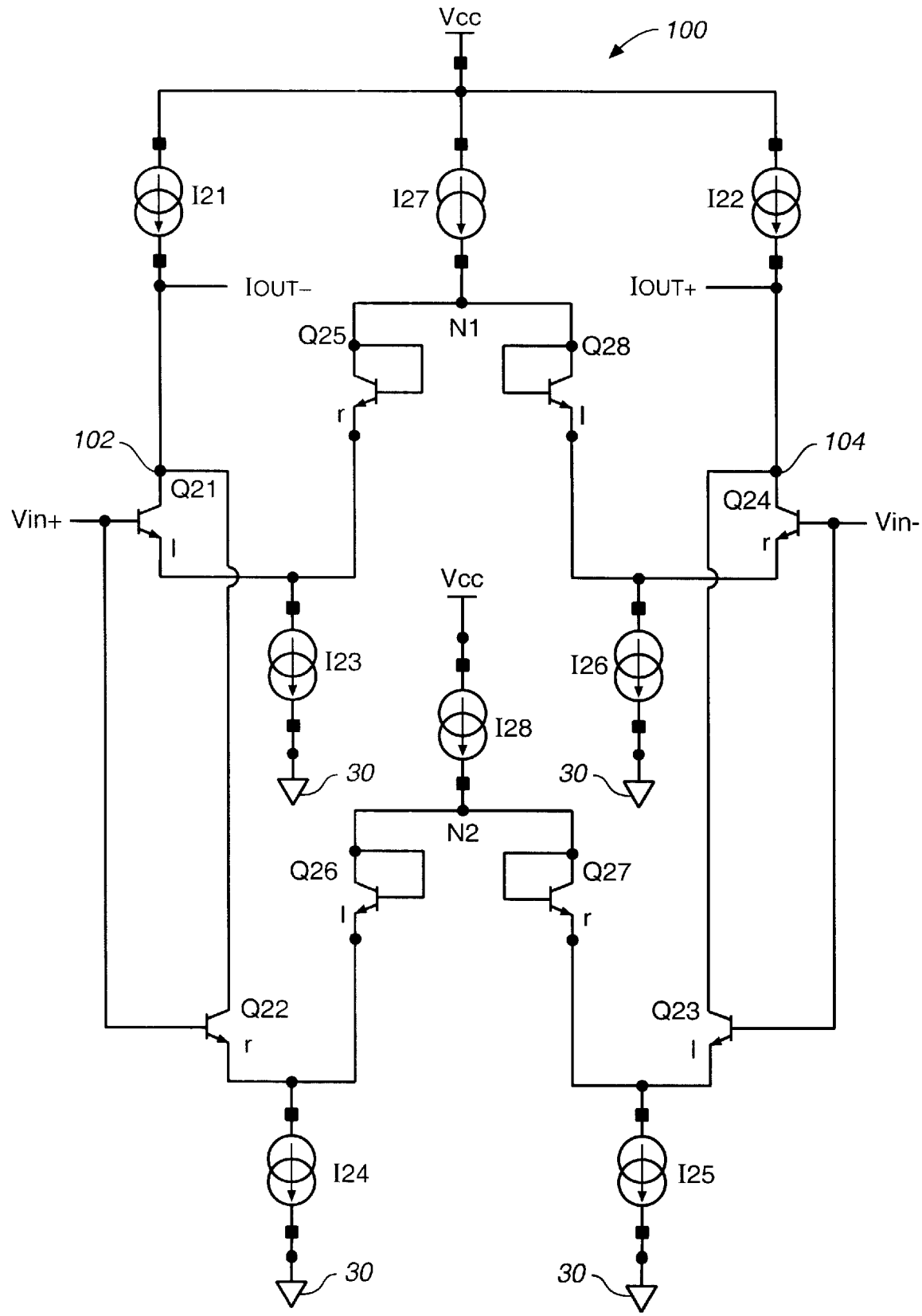
FIG._3A

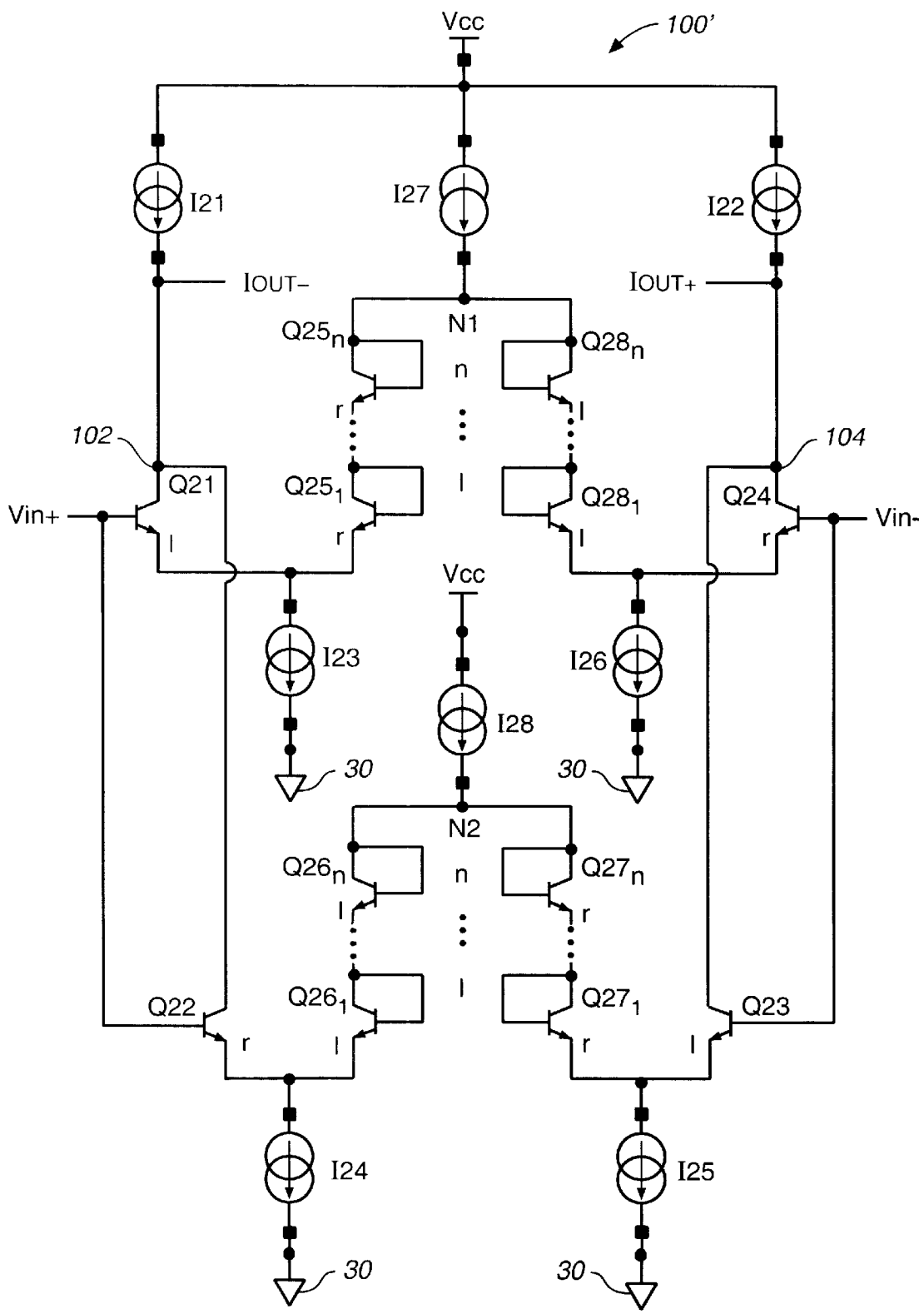
FIG._3B

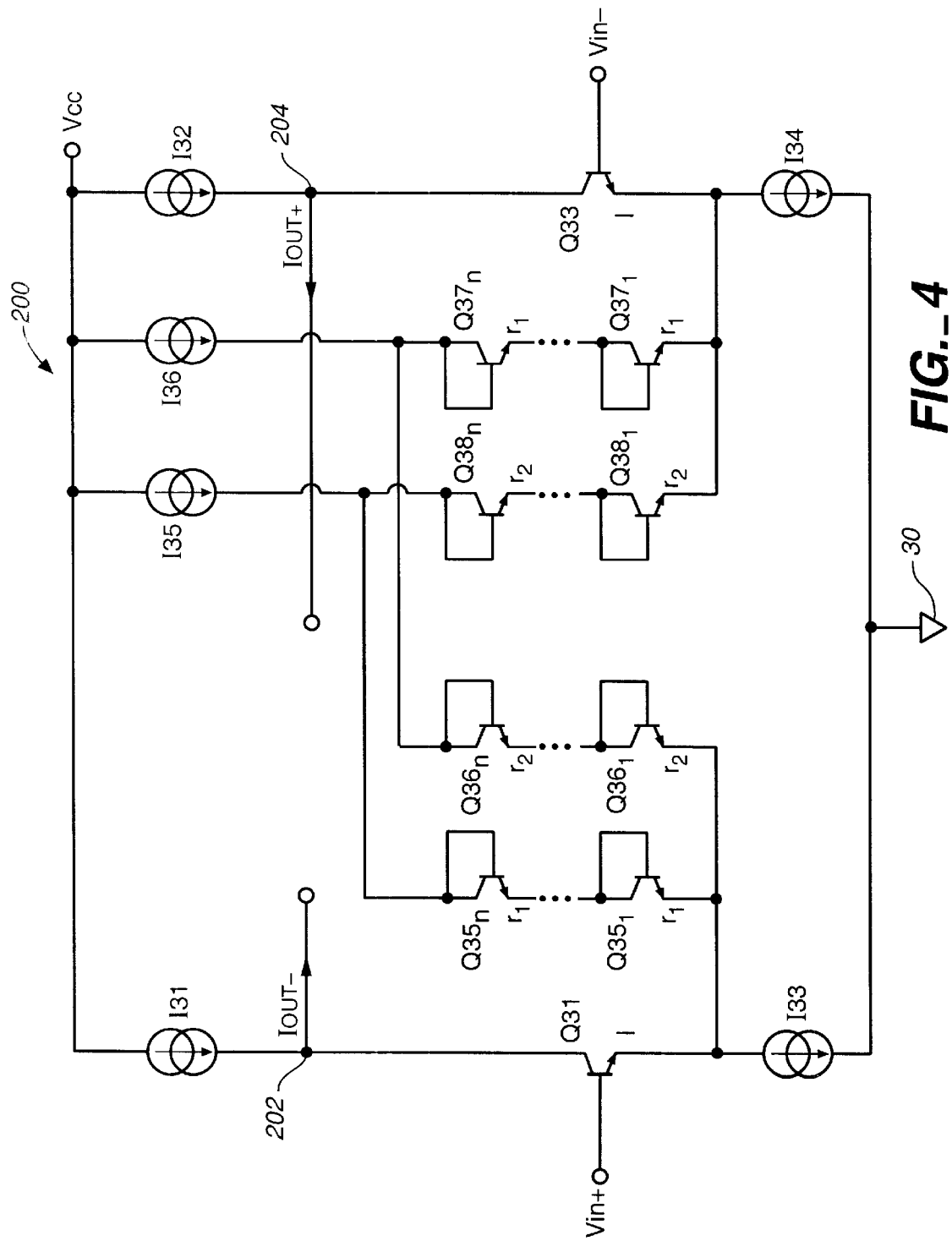
FIG._4

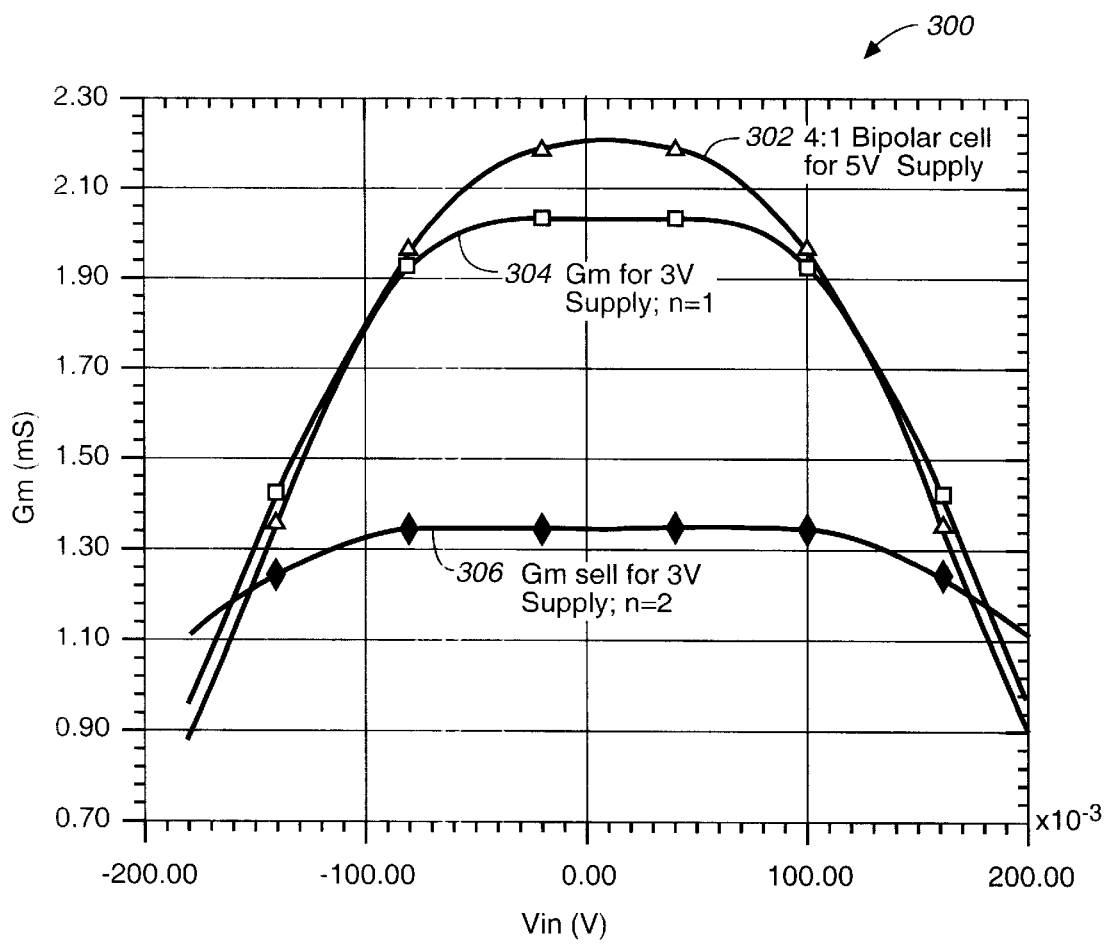
FIG._5

LOW VOLTAGE BIPOLAR TRANSCONDUCTOR CIRCUIT WITH EXTENDED DYNAMIC RANGE

CROSS REFERENCE TO RELATED APPLICATIONS

This application claims priority to U.S. Provisional Patent Application Ser. No. No. 60/102,524 filed on Sep. 30, 1998, which is incorporated herein by reference in its entirety.

BACKGROUND OF THE INVENTION

1. Field of the Invention

The present invention relates generally to analog integrated circuits. More specifically, a low voltage bipolar transconductor circuit with extended dynamic range is disclosed.

2. Description of Related Art

A transconductor circuit is a circuit that converts a voltage input into a current output. The output of a transconductor circuit is dependent upon its gain, measured in units of conductance. The gain of a transconductor circuit is determined by the ratio of its output current $I_O$ to the input voltage $V_{IN}$. The ratio $I_O/V_{IN}$ is defined as the transconductance and is generally represented by $g_m$.

Typically, a transconductor circuit has two voltage inputs $V_1$ and $V_2$. In a normal mode of operation, the input voltages are changed differentially, independent of each other. In a common mode of operation, both input voltages change levels together. Transconductor circuits are often used as linear amplifiers. Measures of the performance of a transconductor circuit operating as a linear amplifier are its input voltage handling capability and its dynamic range.

U.S. Pat. No. 5,289,136, the entirety of which is incorporated by reference herein, discusses several examples of transconductance-based amplifiers such as emitter-coupled pair, series diode linearization, transistor ratio linearization, two differential pairs with ratios in parallel, and amplifiers using level shift techniques.

In analog signal processing, the typical frequency range of operation of linear circuits continues to increase with technological advances. Currently the typical frequency range of operation of linear circuits extends into several hundred Megahertz (MHz) and, in some cases, into the Gigahertz (GHz) range. The high frequency range of operation of linear circuits has been enabled by smaller geometries of integrated chips, necessitating in decreasing supply voltage operation.

For high speed considerations, the bipolar transistor is favored in linear circuits. However, the decrease in supply voltage is placing severe challenges in the design of such bipolar transistor linear circuits.

Accordingly, what is needed is a low supply voltage bipolar transconductor circuit having extended dynamic range which overcomes the supply voltage overhead problem. Preferably, the bipolar transconductor circuit can be operated at a low supply voltage and provide extended dynamic range without sacrificing signal handling capability and performance. Such a low supply voltage bipolar transconductor circuit having extended dynamic range would be particularly useful in high performance, high frequency analog circuits. Examples of such high performance, high frequency analog circuits include differential amplifiers, comparators, and filter transconductor elements.

SUMMARY OF THE INVENTION

A bipolar transconductor circuit is disclosed that is compatible with low supply voltage for operation and provides extended dynamic range. It should be appreciated that the present invention can be implemented in numerous ways, including as a process, an apparatus, a system, a device, or a method. Several inventive embodiments of the present invention are described below.

The transconductance circuit providing a differential current output signal generally comprises a first and a second differential pair of transistors having transistors area ratios of 1:r and r:1, respectively. Bases and collectors of the differential pair of transistors are coupled to a differential input signal and to a load, respectively. The transconductance circuit further comprises a first pair of diodes having positive nodes coupled to each other and to the load, and negative nodes coupled to emitters of the first differential pair of transistors, the first pair of diodes having a diode area ratio of r:1. The transconductance circuit further comprises a second pair of diodes having positive nodes coupled to each other and to the load, the second pair of diodes having negative nodes coupled to emitters of the second differential pair of transistors, the second pair of diodes having a diode area ratio of 1:r.

The transconductance circuit may further comprise at least one additional first pair of diodes and at least one additional second pair of diodes, the at least one additional first pair of diodes has an equal number of diodes as said at least one additional second pair of diodes. The at least one additional first pair of diodes are coupled in series with the first pair of diodes between the first pair of diodes and the first differential pair of transistors, each pair of the additional first pair of diodes having a diode area ratio of r:1. The at least one additional second pair of diodes are coupled in series with the second pair of diodes between the second pair of diodes and the second differential pair of transistors, each pair of the additional second pair of diodes having a diode area ratio of 1:r.

In another embodiment, the transconductance circuit providing a differential current output signal generally comprises a first and a second differential transistor having approximately equal transistors areas. Bases and collectors of the differential transistors are coupled to a differential input signal and to a load, respectively. The transconductance circuit further comprises a first pair of diodes having positive nodes coupled to each other and to the load, and negative nodes coupled to emitters of the differential transistors, the first pair of diodes having a diode area ratio of $r_1:r_2$. The transconductance circuit further comprises a second pair of diodes having positive nodes coupled to each other and to the load, and having negative nodes coupled to emitters of the differential transistors, the second pair of diodes having a diode area ratio of $r_2:r_1$.

The transconductance circuit may further comprise at least one additional first pair of diodes and at least one additional second pair of diodes. The at least one additional first pair of diodes are coupled in series with the first pair of diodes between the first pair of diodes and the differential transistors, each pair of the additional first pair of diodes having a diode area ratio of $r_1:r_2$. The at least one additional second pair of diodes are coupled in series with the second pair of diodes between the first pair of diodes and the differential transistors, each pair of the additional second pair of diodes having a diode area ratio of $r_2:r_1$. In one embodiment, $r_1$ is between approximately 3 and 8 and $r_2$ is between approximately 1 to 2.

These and other features and advantages of the present invention will be presented in more detail in the following detailed description and the accompanying figures which illustrate by way of example the principles of the invention.

BRIEF DESCRIPTION OF THE DRAWINGS

The present invention will readily be understood by the following detailed description in conjunction with the accompanying drawings, wherein like reference numerals designate like structural elements, and in which:

FIG. 1 is a simplified circuit diagram of a common transconductor circuit employing bipolar transistors;

FIG. 2 is a simplified circuit diagram of a modified bipolar transconductor circuit of FIG. 1;

FIG. 3A is a simplified circuit diagram of a low voltage bipolar transconductor circuit which provides extended dynamic range;

FIG. 3B is a simplified circuit diagram of a low voltage bipolar transconductor circuit which provides extended dynamic range;

FIG. 4 is a simplified circuit diagram of another low voltage bipolar transconductor circuit which provides extended dynamic range; and FIG. 5 shows simulated graphs of relative transconductance $g_m$ versus differential voltage input $V_{in}$ for the transconductance circuits of FIGS. 2, 3A, and 3B.

DESCRIPTION OF SPECIFIC EMBODIMENTS

A bipolar transconductor circuit that requires low supply voltages for operation and that provides extended dynamic range is disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

FIG. 1 is a simplified circuit diagram of a common bipolar transconductor circuit 20 employing transistors Q1–Q4 and current sources I1–I4. The bipolar transconductor circuit 20 is a transconductance-based amplifier employing two pairs of transistors with bases differentially coupled to an input voltage and with respective emitter area ratios of 1:r and r:1 in parallel.

The input voltage signal $V_{in}$ of the bipolar transconductor circuit 20 is differentially coupled to the bases of transistors Q1 and Q4. The input voltage signal $V_{in}$ is also differentially coupled to the bases of transistors Q2 and Q3. In particular, a positive node $V_{in+}$ of $V_{in}$ is coupled to the bases of transistors Q1 and Q2 and a negative node $V_{in-}$ of $V_{in}$ is coupled to the bases of transistors Q3 and Q4. The collectors of transistors Q1 and Q2 are coupled to each other at a node 22 and to a current source I1. The collectors of transistors Q3 and Q4 are coupled to each other at node 24 as well as to a current source I2. The current sources I1 and I2 are in turn coupled to a load or voltage supply $V_{cc}$.

The emitters of transistor pair Q1 and Q4 have an area ratio of r:1, preferably a transistor area ratio of 4:1, and are coupled to each other at a node 26 and to a current source I3. The emitters of transistor pair Q2 and Q3 have a transistor area ratio of 1:r, preferably a transistor area ratio of 1:4, and are coupled to each other at a node 28 and to a current source I4. The current sources I3 and I4 are in turn coupled to ground 30. Each of the current sources I1–I4 are preferably of approximately equal magnitude.

The bipolar transconductance circuit 20 provides a differential output current $I_{out}$. The differential output current $I_{out}$ is taken as the difference between the current value $I_{out+}$ and $I_{out-}$.

As noted, in the embodiment shown in FIG. 1, the transistors Q1–Q4 have emitter area ratios of approximately 4:1 and 1:4. These emitter area ratios are selected to improve the signal handling capability of a simple differential pair transistors. The common bipolar transconductor circuit 20 supports an input signal of approximately 100 mV peak to peak differential ("ppd") for better than approximately 40 dB linearity while retaining high frequency properties of a differential transistor pair.

FIG. 2 is a circuit diagram of another bipolar transconductor circuit 50 similar to the bipolar transconductor circuit disclosed in U.S. Pat. No. 5,289,136, referenced above. The bipolar transconductor circuit 50 is modified relative to the bipolar transconductor circuit 20 shown in FIG. 1 to approximately double the signal range and may be used for Gm-C integrators in filters operating with 5 V supply voltages.

The input voltage signal $V_{in}$ of the bipolar transconductance circuit 50 is differentially coupled to the bases of bipolar junction transistors ("BJT") Q11, Q12, Q13, and Q14. In particular, a positive node $V_{in+}$ of $V_{in}$ is coupled to the bases of transistors Q11 and Q12 and a negative node $V_{in-}$ of $V_{in}$ is coupled to the bases of transistors Q13 and Q14. The collectors of the transistors Q11 and Q12 are coupled to each other at a node 52 and to a current source I11. The collectors of the transistors Q13 and Q14 are similarly coupled to each other at node 54 and to a current source I12. The current sources I11 and I12 are in turn coupled to a voltage supply $V_{cc}$.

A diode is coupled to each emitter of the transistors Q11–Q14 of the transconductance circuit 50. Specifically, the emitters of transistors Q11, Q12, Q13, and Q14 are coupled to a positive node of diodes Q15, Q16, Q17, and Q18, respectively. A negative node of the diode Q15 is coupled to a negative node of the diode Q18 at a node 56 and to a current source I13. A negative node of the diode Q16 is coupled to a negative node of the diode Q17 at a node 58 and to a current source I14. The current sources I13 and I14 are in turn coupled to ground 30. Each of the current sources I11–I14 are generally of approximately equal magnitude.

The bipolar transconductance circuit 50 provides a differential output current $I_{out}$. The differential output current $I_{out}$ is taken as the difference between the current value $I_{out+}$ and $I_{out-}$.

Each differential transistor pair has ratioed transistor areas. The transistor areas of transistors Q11 and Q14 have a ratio of 1:r and preferably a ratio of 1:4. The transistor areas of transistors Q12 and Q13 have a ratio of r:1 and preferably a ratio of 4:1. The diode areas are designed to follow the same ratios set by the transistors to which the diodes are coupled. Thus, the diode areas of diodes Q15 and Q18 also have a ratio of 1:r and preferably a ratio of 1:4. In addition, the diode areas of diodes Q16 and Q17 also have a ratio of r:1 and preferably a ratio of 4:1. In the embodiment shown in FIG. 2, r is approximately 4.

The addition of the diodes serially coupled to the emitters of the transistors in the bipolar transconductor circuit 50 increases the signal handling capability more then the increase in the equivalent input noise. The signal to noise ratio ("SNR") of the bipolar transconductor circuit 50 would be approximately 3 dB better than that of the bipolar transconductor circuit 20 of FIG. 1.

However, the structure of the bipolar transconductor circuit 50 generally requires a 5 V supply voltage as the bipolar transconductor circuit 50 would run out of headroom if it were used with a 3V voltage supply under worst case operating conditions. In particular, the minimum supply voltage $V_{cc,min}$ can be approximately expressed by:

$$V_{cc,min} = 2V_{be} + V_{dsat}(\text{tail}) + V_{dsat}(\text{load}) + V_{buffer} + V_{signal}$$

Using typical worst case $V_{be}$, $V_{dsat}(\text{tail})$, $V_{dsat}(\text{load})$, $V_{buffer}$, $V_{signal}$ values of 0.8 V, 0.4 V, 0.8 V, 0.8 V, and 0.1 V, respectively, for the quantities in the above equation yields a lower bound on the minimum supply voltage $V_{cc,min}$ of approximately 3.7 V:

$$V_{cc,min} = 2(0.8\ V) + 0.4\ V + 0.8\ V + 0.8\ V + 0.1\ V = 3.7\ V$$

Thus, as illustrated above, the structure of the bipolar transconductor circuit 50 may require a supply voltage $V_{cc}$ of approximately 4 V.

FIG. 3A is a simplified circuit diagram of a bipolar transconductor circuit 100 designed to operate at a low supply voltage $V_{cc}$, i.e. approximately 3 V or less.

The input voltage signal $V_{in}$ of the bipolar transconductance circuit 100 is differentially coupled to the bases of BJTs Q21, Q22, Q23, and Q24. In particular, a positive node of $V_{in}$ is coupled to the bases of transistors Q21 and Q22 and a negative node of $V_{in}$ is coupled to the bases of transistors Q23 and Q24. The collectors of the transistors Q21 and Q22 are coupled to each other at a node 102 and to a transistor current source I21. The collectors of the transistors Q23 and Q24 are coupled to each other at node 104 and to a transistor current source I22. The current sources I21 and I22 are in turn coupled to a voltage supply $V_{cc}$.

A diode is coupled to each emitter of the transistors Q21–Q24 of the transconductance circuit 100. Specifically, the emitters of transistors Q21, Q22, Q23, and Q24 are coupled to negative nodes of diodes Q25, Q26, Q27, and Q28 and to tail current sources I23, I24, I25 and I26, respectively. The tail current sources I23, I24, I25 and I26 are in turn coupled to ground 30.

A positive node of the diode Q25 is coupled to a positive node of the diode Q28 and to a diode current source I27 at a node N1. Similarly, a positive node of the diode Q26 is coupled to a positive node of the diode Q27 and to a diode current source I28 at a node N2. The current sources I27 and I28 are in turn coupled to the voltage supply $V_{cc}$. Each of the current sources I21, I22, I27, and I28 coupled to the voltage supply $V_{cc}$ is preferably of approximately equal magnitude. Similarly, each of the current sources I23, I24, I25 and I26 coupled to the ground 30 is preferably of approximately equal magnitude. In addition, the sum of the magnitudes of current sources I21, I22, I27, and I28 is preferably approximately equal to the sum of the magnitudes of current sources I23, I24, I25 and I26.

The bipolar transconductance circuit 100 provides a differential output current $I_{out}$. The differential output current $I_{out}$ is taken as the difference between the current value $I_{out+}$ and $I_{out-}$.

Each differential transistor pair has ratioed transistor areas. The transistor areas of transistors Q21 and Q24 have a ratio of 1:r. The transistor areas of transistors Q22 and Q23 have a ratio of r:1. The diode areas are designed to be inverse of the ratios set by the transistors to which the diodes are coupled. Thus, the diode areas of diodes Q25 and Q28 have a ratio of r:1. In addition, the diode areas of diodes Q26 and Q27 have a ratio of 1:r. In the embodiment shown in FIG. 3A, r is optimized to be approximately 4.

Comparing the bipolar transconductance circuit 100 of FIG. 3A with the bipolar transconductance circuit 50 of FIG. 2, the diodes Q25–Q28 of the circuit 100 are folded relative to the corresponding diodes Q15–Q18 of the circuit 50 of FIG. 2, respectively. In other words, rather than having the positive node of each diode Q15–Q18 be coupled to the emitter of a corresponding transistor Q11–Q14 as in circuit 50 (FIG. 2), the negative node of each corresponding diode Q25–Q28 are coupled to the emitter of a corresponding transistor Q21–Q24 in circuit 100 (FIG. 3). Consequently, additional current sources I27 and I28 coupled to the voltage supply $V_{cc}$ are provided in the circuit 100.

The folded configuration allows for operation at a lower supply voltage $V_{cc}$. The minimum supply voltage $V_{cc}$ for the folded configuration transconductance circuit 100 in a high frequency application utilizing a filter is lowered by an amount approximately equal to $V_{BE}$ as compared to conventional transconductance circuits.

Using the worst case values in the equations above for $V_{cc}$, the lower bound for the supply voltage $V_{cc}$ would be approximately 3.7 V less $V_{BE}$ of approximately 0.8 V, or a minimum $V_{cc}$ of approximately 2.9 V. Thus, in high frequency filter applications or where a buffer may otherwise be incorporated into the transconductance circuit utilized, the worst case minimum $V_{cc}$ would be approximately 2.9 V.

In lower frequency filter applications or where a buffer is otherwise not incorporated in the transconductance circuit, the worst case minimum $V_{cc}$ would also be lowered. In such an application, the minimum supply voltage $V_{cc}$ can be expressed by:

$$V_{cc} = V_{be} + V_{dsat}(\text{tail}) + V_{dsat}(\text{load}) + V_{signal}$$

Accordingly, the minimum supply voltage $V_{cc}$ is:

$$V_{cc} = 0.8\ V + 0.2\ V + 0.2\ V + 0.1\ V = 1.3\ V$$

Thus, the bipolar transconductance circuit 100 of FIG. 3A can operate at a supply voltage $V_{cc}$ of as low as 1.3 V and provide bandwidths in excess of 10 GHz.

While operating at a lowered supply voltage $V_{cc}$ of 3 V, the bipolar transconductance circuit 100 still has a signal handling capability approximately equal to or greater than that of the 4:1 transconductance circuit 50 shown in FIG. 2 that uses supply voltage $V_{cc}$ of 5 V. However, the power supply current of the transconductance circuit 100 of FIG. 3A is also approximately doubled when compared to the .4:1 transconductance circuit 50 shown in FIG. 2. The increase in current by a factor of 2 and the decrease in supply voltage $V_{cc}$ from 5 V to 3V results in a small increase in power consumption by the transconductance circuit.

Another feature and advantage of the folded configuration of the bipolar transconductance circuit 100 is that, because of perfect symmetry, the nodes N1 and N2 are at virtual AC grounds for low frequencies if the effects of the parasitic capacitance and/or resistance of the NMOS current sources I23–I26 are neglected. Thus, there is no loading due to the current sources at nodes N1 and N2 and these nodes are insensitive to the common mode impedances due to the PMOS current sources. This is in contrast to the corresponding terminals in the structure of the transconductance circuit 50 shown in FIG. 2.

FIG. 3B is a generalized circuit diagram of a bipolar transconductor circuit 100' also designed to operate at a low supply voltage $V_{cc}$, i.e. approximately 3 V or less. The bipolar transconductor circuit 100' of FIG. 3B differs from the bipolar transconductor circuit 100 of FIG. 3A in that circuit 100' includes stacked diodes. Specifically, each of the diodes Q25–Q28 of circuit 100 are replaced by n number of serially stacked diodes $Q25_{1-n}$, $Q26_{1-n}$, $Q27_{1-n}$, and $Q28_{1-n}$ in circuit 100'.

As shown in FIG. 3B, the n stacked diodes $Q25_{1-n}$–$Q28_{1-n}$ are serially stacked such that the positive node of the diode $Q25_n$ is coupled to the positive node of the diode $Q28_n$ and to the current source I27. Similarly, the positive node of the diode $Q26_n$ is coupled to the positive node of the diode $Q27_n$ and to the current source I28.

As is evident, the folded configuration of the transconductance circuit allows the employment of a plurality of serially stacked diodes $Q25_{1-n}$–$Q28_{1-n}$. The selection of the number n of serially stacked diodes provides flexibility in trading-off between the level of the power supply voltage and the dynamic range and the circuit SNR. The number n of serially stacked diodes coupled to each bipolar transistor of the transconductor circuit can also be optimized to the supply voltage $V_{cc}$.

The diodes of each serial stack of diodes coupled to one of the transistors Q21–24 of the transconductance circuit 100' have the same diode areas. Further, the diode areas of the serial stack of diodes coupled to each transistor Q21–24 are designed to be inverse of the ratios set by the transistors to which the diodes are coupled. Thus, the diode areas of diodes $Q25_{1-n}$ and $Q28_{1-n}$ have a ratio of r:1. In addition, the diode areas of diodes $Q26_{1-n}$ and $Q27_{1-n}$ have a ratio of 1:r.

The transconductor circuit 100 shown in FIG. 3A is simply the case where n=1. For n=2, the parameter r is optimized to be approximately 4 and the input signal range is increased by approximately 50% over the n=1 case. This increased input signal range translates into a 1.8 dB SNR improvement. However, in contrast to the n=1 case, in the n=2 case, the nodes N1 and N2 are not at virtual AC ground and a slight sensitivity to parasitic capacitance and/or resistance may result. The parasitic capacitance may result in a slight phase lead which is typically overshadowed by the inherent phase lag of the circuit. For application that do not require a large $V_{dsat}$ for the PMOS current source and an extra buffering emitter follower, this Gm cell can operate at supply voltages as low as approximately 2.1 V.

FIG. 4 is a simplified circuit diagram of another bipolar transconductor circuit 200 designed to operate at a low supply voltage $V_{cc}$, i.e. approximately 3 V or less. The bipolar transconductor circuit 200 of FIG. 4 is a simpler alternative to the circuits 100, 100' of FIGS. 3A and 3B.

The input voltage signal $V_{in}$ of the bipolar transconductance circuit 200 is differentially coupled to the bases of BJTs Q31 and Q33. In particular, a positive node of $V_{in}$ is coupled to a base of transistor Q31 and a negative node of $V_{in}$ is coupled to a base of transistor Q33. A collector of the transistor Q31 is coupled to a node 202 and to a transistor current source I31. A collector of the transistor Q33 is coupled to a node 204 and to a transistor current source I32. The current sources I31 and I32 are in turn coupled to a voltage supply $V_{cc}$.

Two folded and serial stacks of diodes are coupled to each emitter of the transistors Q31 and Q33 of the transconductance circuit 200. Specifically, the emitter of the transistor Q31 is coupled to negative nodes of a first diode $Q35_1$ of the stack of n diodes $Q35_{1-n}$ and to a first diode $Q36_1$ of the stack of n diodes $Q36_{1-n}$. The emitter of the transistor Q31 is also coupled to a tail current source I33. In addition, the emitter of the transistor Q33 is coupled to negative nodes of a first diode $Q37_1$ of the stack of n diodes $Q37_{1-n}$ and to a first diode $Q38_1$ of the stack of n diodes $Q38_{1-n}$. The emitter of the transistor Q33 is also coupled to a tail current source I34. The current sources I33 and I34 are in turn coupled to each other and to ground 30.

Each of the stack of n diodes $Q35_{1-n}$–$Q38_{1-n}$ are serially stacked as shown in FIG. 4. The positive nodes of the $n^{th}$ diode $Q35_n$ and $Q38_n$ of the stack of diodes Q35 and Q38, respectively, are coupled to each other and to a negative node of a diode current source I35. In addition, the positive nodes of the $n^{th}$ diode $Q36_n$ and $Q37_n$ of the stack of diodes Q36 and Q37, respectively, are coupled to each other and to a current source I36. The current sources I35 and I36 are in turn coupled to the voltage supply $V_{cc}$.

Each of the current sources I31, I32, I35, and I36 coupled to the voltage supply $V_{cc}$ is preferably of approximately equal magnitude. Similarly, each of the current sources I33 and I34 coupled to the ground 30 is preferably of approximately equal magnitude. In addition, the sum of the magnitudes of current sources I31, I32, I35, and I36 is approximately equal to the sum of the magnitudes of current sources I33 and I34.

The bipolar transconductance circuit 200 provides a differential output current $I_{out}$. The differential output current $I_{out}$ is taken as the difference between the current value $I_{out+}$ and $I_{out-}$.

The differential transistor pair Q31 and Q33 preferably has the same transistor areas. The diode areas of the serial stacks of diodes Q35 and Q36 coupled to the emitter of the transistor Q31 are $r_1$ and $r_2$, respectively, relative to the transistor area of the transistor Q31. In addition, the diode areas of the serial stacks of diodes Q38 and Q37 coupled to the emitter of the transistor Q33 are $r_2$ and $r_1$, respectively, relative to the transistor area of the transistor Q33. Thus, the diode areas of the stacks of diodes Q35 and Q38 have a ratio of $r_1:r_2$. In addition, the areas of the stacks of diodes Q36 and Q37 have a ratio of $r_2:r_1$. For example, in one embodiment, $r_1$ and $r_2$ optionally range from approximately 3 to 8 and approximately 1 to 2, respectively, and the number of diodes in each stack of diodes n optionally ranges from 1 to 2.

The transconductance circuit 200 shown in FIG. 4 is more complex than the circuits 100 and 100' shown in FIGS. 3A and 3B in that the transconductance circuit 200 has two emitter ratios $r_1$ and $r_2$ as design parameters. For n=1, the transconductance circuit 200 shown in FIG. 4 can operate at a supply voltage $V_{cc}$ as low as approximately 1.3 V. In addition, the transconductance circuit 200 of FIG. 4 has a slightly larger linear range and a lower transconductance than the transconductance circuit 100, 100' of FIGS. 3A and 3B.

In each of the embodiments shown and described herein, the differential output current $I_{out}$ can be expressed as:

$$I_{out} = I_{out+} - I_{out+}$$

The differential voltage input $V_{in}$ can be expressed as:

$$V_{in} = V_{in+} - V_{in-}$$

In addition, the transconductance $g_m$ can be expressed as:

$$g_m = \partial I_{out} / \partial V_{in}$$

FIG. 5 shows simulated graphs 300 of relative transconductance $g_m$ versus differential voltage input $V_{in}$. Line 302 is a plot of trasconductance $g_m$ versus differential voltage input $V_{in}$ for a 4:1 ratioed bipolar transconductance circuit such as the transconductance circuit 50 shown in FIG. 2 with a supply voltage $V_{cc}$ of approximately 5 V.

Line 304 is a plot of transconductance $g_m$ versus differential voltage input $V_{in}$ for the ratioed bipolar transconductance circuit 100 shown in FIG. 3A with a supply voltage $V_{cc}$ of approximately 3 V. As noted above, the bipolar transconductance circuit 100 shown in FIG. 3A is similar to or same as the bipolar transconductance circuit 100' shown in FIG. 3B with n=1.

Line 306 is a plot of transconductance $g_m$ versus differential voltage input $V_{in}$ for the ratioed bipolar transconductance circuit 100' shown in FIG. 3B with n=2 and with a supply voltage $V_{cc}$ of approximately 3 V. The ratioed bipolar transconductance circuit 100, 100', or 200 can operate at a lower supply voltage $V_{cc}$ with an extended dynamic range. With a larger n, the transconductance is decreased with an increase extended dynamic range and SNR.

With n=1, the transconductor circuit 100' shown in FIG. 3B may support an input signal of approximately 200 mV ppd with better than approximately 40 dB linearity. With n=2, the transconductor circuit 100' shown in FIG. 3B may support an input signal of approximately 300 mV ppd with similar linearity as in the n=1 case. The signal handling capability of the transconductance circuit as expressed in terms of ppd is proportional to the number of diodes in the circuit.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A transconductance circuit, comprising:

a first and a second differential pair of transistors having transistors area ratios of 1:r and r:1, respectively, said first and second differential pairs of transistors having bases and collectors coupled to a differential input signal and to a load, respectively, said first and second differential pair of transistors providing a differential current output signal;

a first pair of diodes having positive nodes coupled to each other, said first pair of diodes having negative nodes coupled to emitters of said first differential pair of transistors, said first pair of diodes having a diode area ratio of r:1; and a second pair of diodes having positive nodes coupled to each other, said second pair of diodes having negative nodes coupled to emitters of said second differential pair of transistors, said second pair of diodes having a diode area ratio of 1:r.

2. The transconductance circuit of claim 1, further comprising a first and second diode current source coupled to the positive nodes of said first and second pairs of diodes, respectively, wherein each of said first and second differential pair of transistors comprises a positively coupled transistor and a negatively coupled transistor having bases coupled to a positive node and a negative node of the differential input signal, respectively, and a collector coupled to said first and second diode current source, respectively.

3. The transconductance circuit of claim 2 wherein said load comprises a first and second transistor current source said first transistor current source being coupled to collector nodes of the positively coupled transistors of said first and second differential pair of transistors, and said second transistor current source being coupled to collector nodes of the negatively coupled transistors of said first and second differential pair of transistors.

4. The transconductance circuit of claim 3, wherein said differential current output signal is taken as a current from a second node to a first node, said first node being between said first transistor current source and the collector nodes of the positively coupled transistors of said first and second differential pairs of transistors, said second node being between said second transistor current source and the collector nodes of the negatively coupled transistors of said first and second differential pair of transistors.

5. The transconductance circuit of claim 1, further comprising a plurality of tail current sources coupled to ground, each tail current source being coupled to the emitter of one of the transistors and to a negative node of one of said diodes to which said emitter of said one of the transistors is coupled.

6. The transconductance circuit of claim 1, wherein r is approximately equal to 4.

7. The transconductance circuit of claim 1, further comprising:

at least one additional first pair of diodes coupled in series with said first pair of diodes between said first pair of diodes and said first differential pair of transistors, each pair of said at least one additional first pair of diodes having a diode area ratio of r:1; and at least one additional second pair of diodes coupled in series with said second pair of diodes between said second pair of diodes and said second differential pair of transistors, each pair of said at least one additional second pair of diodes having a diode area ratio of 1:r, said at least one additional first pair of diodes has an equal number of diodes as said at least one additional second pair of diodes.

8. A transconductance circuit, comprising:

a first and a second differential transistor having approximately equal transistors areas, said first and second differential transistors having bases coupled to a differential input signal and having collectors coupled to a load, said first and second differential transistors providing a differential current output signal;

a first pair of diodes having positive nodes coupled to each other, said first pair of diodes further having negative nodes coupled to emitters of said first and second differential transistors, said first pair of diodes having a diode area ratio of $r_1:r_2$, and a second pair of diodes having positive nodes coupled to each other, said second pair of diodes further having negative nodes coupled to emitters of said first and second differential transistors, said second pair of diodes having a diode area ratio of $r_2:r_1$.

9. The transconductance circuit of claim 8, wherein said base of said first differential transistor is coupled to a positive node of the differential input signal, said base of said second differential transistor is coupled to a negative node of the differential input signal, said transconductance circuit further comprising a first and second diode current source, said first diode current source being coupled to positive nodes of said first pair of diodes and said second diode current source being coupled to positive nodes of said second pair of diodes.

10. The transconductance circuit of claim 9 wherein said load comprises a first and second transistor current source, said first transistor current source being coupled to said collector node of the first differential transistor, and said second transistor current source being coupled to said collector node of the second differential transistor.

11. The transconductance circuit of claim 10, wherein said differential current output signal is taken as a current from a second node to a first node, said first node being between said first transistor current source and the collector node of the first differential transistor, said second node being between said second transistor current source and the collector node of the second differential transistor.

12. The transconductance circuit of claim 8, further comprising a first and a second tail current source coupled to ground, said first tail current source being coupled to the emitter of said first differential transistor and to negative nodes of diodes to which said emitter of said first differential transistor is coupled, said second tail current source being coupled to the emitter of said second differential transistor and to negative nodes of diodes to which said emitter of said second differential transistor is coupled.

13. The transconductance circuit of claim 8, further comprising:

at least one additional first pair of diodes coupled in series with said first pair of diodes between said first pair of diodes and said first and second differential transistors, each pair of said at least one additional first pair of diodes having a diode area ratio of $r_1:r_2$; and at least one additional second pair of diodes coupled in series with said second pair of diodes between said first pair of diodes and said first and second differential transistors, each pair of said at least one additional second pair of diodes having a diode area ratio of $r_2:r_1$.

14. The transconductance circuit of claim 8, wherein $r_1$ is a value between approximately 3 and 8 and $r_2$ is a value between approximately 1 to 2.

* * * * *